US010622415B2

(12) United States Patent
Xu et al.

(10) Patent No.: US 10,622,415 B2
(45) Date of Patent: Apr. 14, 2020

(54) FINGERPRINT RECOGNITION DEVICE AND OLED DISPLAY DEVICE

(71) Applicant: BOE TECHNOLOGY GROUP CO., LTD., Beijing (CN)

(72) Inventors: Rui Xu, Beijing (CN); Haisheng Wang, Beijing (CN); Yingming Liu, Beijing (CN); Pengpeng Wang, Beijing (CN); Chih-Jen Cheng, Beijing (CN); Yunke Qin, Beijing (CN); Yuzhen Guo, Beijing (CN); Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 177 days.

(21) Appl. No.: 15/754,248

(22) PCT Filed: Sep. 15, 2017

(86) PCT No.: PCT/CN2017/101961
§ 371 (c)(1),
(2) Date: Feb. 21, 2018

(87) PCT Pub. No.: WO2018/153068
PCT Pub. Date: Aug. 30, 2018

(65) Prior Publication Data
US 2019/0019850 A1 Jan. 17, 2019

(30) Foreign Application Priority Data
Feb. 24, 2017 (CN) .......................... 2017 1 0105957

(51) Int. Cl.
*G06K 9/00* (2006.01)
*H01L 27/32* (2006.01)
(Continued)

(52) U.S. Cl.
CPC .......... *H01L 27/3225* (2013.01); *G02B 27/30* (2013.01); *G06K 9/0004* (2013.01);
(Continued)

(58) Field of Classification Search
CPC ............. G06K 9/00006; G06K 9/0004; G06K 9/00087; G06K 9/0008; H01L 27/3225;
(Continued)

(56) References Cited

U.S. PATENT DOCUMENTS

2003/0190763 A1* 10/2003 Cok ................... H01L 27/3211
438/22
2003/0215117 A1 11/2003 Hata
(Continued)

FOREIGN PATENT DOCUMENTS

| CN | 103729093 A | 4/2014 |
| CN | 105550664 | * 5/2016 ............... G06K 9/00 |

(Continued)

OTHER PUBLICATIONS

Chinese Office Action issued in Application No. 201710105957.6 dated Dec. 14, 2018, with English translation.
(Continued)

*Primary Examiner* — Amara Abdi
(74) *Attorney, Agent, or Firm* — McDermott Will & Emery LLP (57) ABSTRACT

A fingerprint recognition device and an OLED display device, which relate to the technical field of display and can solve the problems of a low recognition accuracy due to a large distance from a finger to a fingerprint recognition device. The fingerprint recognition device comprises recognition units alternately defined by a plurality of scanning lines and signal reading lines which are crisscrossed with each other. Each recognition unit is provided with a switching transistor and a photosensitive element. The photosen-
(Continued)

sitive element comprises a photoelectric conversion layer and a collimator filter layer which are stacked successively. The collimator filter layer is used for irradiating incident light onto the photoelectric conversion layer in parallel, and the photoelectric conversion layer is used for performing photoelectric conversion on the incident light.

12 Claims, 5 Drawing Sheets

(51) Int. Cl.
*G02B 27/30* (2006.01)
*H01L 27/30* (2006.01)

(52) U.S. Cl.
CPC ........ *G06K 9/00006* (2013.01); *H01L 27/307* (2013.01); *H01L 27/3211* (2013.01); *H01L 27/3234* (2013.01)

(58) Field of Classification Search
CPC ............. H01L 27/3211; H01L 27/3234; H01L 27/307; G02B 27/30
See application file for complete search history.

(56) References Cited

U.S. PATENT DOCUMENTS

2017/0351364 A1* 12/2017 Kim ...................... G06F 3/0416
2018/0151638 A1*  5/2018 Luo .................... G06K 9/00013

FOREIGN PATENT DOCUMENTS

| CN | 105550664 A | 5/2016 |
| CN | 106055162 A | 10/2016 |
| CN | 106228147 A | 12/2016 |
| CN | 106355160 A | 1/2017 |
| CN | 106897699 A | 6/2017 |

OTHER PUBLICATIONS

International Search Report and Written Opinion issued in International Patent Application No. PCT/CN2017/101961 dated Dec. 7, 2017; with partial English translation.

Notification of the First Office Action issued in Chinese Patent Application No. 201710105957.6, dated Apr. 4, 2018; with English translation.

* cited by examiner

FINGERPRINT RECOGNITION DEVICE AND OLED DISPLAY DEVICE

CROSS-REFERENCE TO RELATED APPLICATIONS

The present application is the U.S. National Phase under 35 U.S.C. § 371 of International Patent Application No. PCT/CN2017/101961, filed on Sep. 15, 2017, which in turn claims priority to Chinese Patent Application No. 201710105957.6 filed to the China Patent Bureau on Feb. 24, 2017 and entitled "FINGERPRINT RECOGNITION DEVICE AND OLED DISPLAY DEVICE", the disclosure of which is hereby incorporated by reference in its entirety.

FIELD OF TECHNOLOGY

The present disclosure relates to the technical field of display, and in particular to a fingerprint recognition device and an OLED display device.

BACKGROUND OF THE INVENTION

Due to the uniqueness and immutability of the somatic fingerprint, the fingerprint recognition technology is good in security, high in reliability and simple and convenient to use, so that the fingerprint recognition technology has been widely applied in various fields for protecting personal information security, particularly in display devices, for example, mobile phones, notebook computers, tablet computers, digital photo frames and the like.

Figure 1:
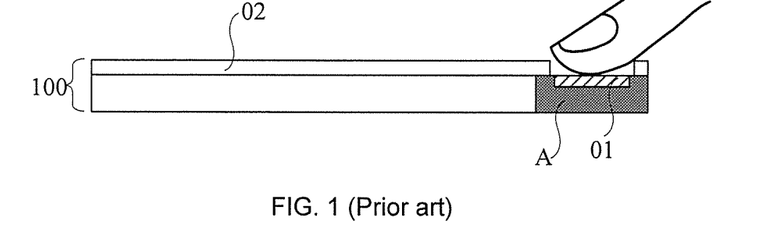
FIG. 1 is a structure diagram of a display device equipped with a fingerprint recognition device in the prior art.

To enable a display device to have a fingerprint recognition function, as shown in FIG. 1, a fingerprint recognition device 01 is generally provided within a non-display region A of the display device 100. When a finger comes into contact with cover glass 02 of the display device at a position corresponding to the fingerprint recognition device 01, the fingerprint recognition device 01 can recognize the fingerprint of a user.

Since the distance from the finger to the fingerprint recognition device 01 is increased by the cover glass 02, the recognition accuracy will be reduced. In order to solve this problem, a touch hole is generally formed on the cover glass 02 at a position corresponding to the fingerprint recognition device, so that the finger comes into contact with the fingerprint recognition device 01 through the tough hole and the recognition accuracy is thus improved. However, in this case, it is necessary to add a cutting process during the preparation of the display device, so that the defective rate and the production cost are increased.

SUMMARY OF THE INVENTION

Embodiments of the present disclosure provide a fingerprint recognition device and an OLED display device, which can solve the problems of a low recognition accuracy due to a large distance from a finger to a fingerprint recognition device.

For this purpose, the embodiments of the present disclosure employ the following technical solutions.

In one aspect of the embodiments of the present disclosure, a fingerprint recognition device is provided. The fingerprint recognition device includes a plurality of recognition units alternately defined by a plurality of scanning lines and a plurality of signal reading lines which are crisscrossed with each other. One of the plurality of recognition units is provided with a switching transistor and a photosensitive element, wherein, a first electrode of the switching transistor is connected to a corresponding one of the plurality of signal reading lines defining this recognition unit and a gate of the switching transistor is connected to a corresponding one of the plurality of scanning lines defining this recognition unit. The photosensitive element includes a photoelectric conversion layer and a collimator filter layer which are stacked successively, with the photoelectric conversion layer being connected to a second electrode of the switching transistor. The collimator filter layer is used for making incident light irradiate onto the photoelectric conversion layer in parallel, and the photoelectric conversion layer is used for performing photoelectric conversion on the incident light.

Preferably, the collimator filter layer and the photoelectric conversion layer are of an integral structure, and the collimator filter layer and the photoelectric conversion layer are made of the same material, i.e., black organic photoelectric material.

Preferably, the photosensitive element completely covers the switching transistor; and, an insulating layer is provided between the photoelectric conversion layer and the switching transistor, a via hole is formed on the insulating layer at a position corresponding to the second electrode of the switching transistor, and the photoelectric conversion layer is connected to the second electrode of the switching transistor through the via hole.

Preferably, the area of the photosensitive element is the same as the area of an opening of the recognition unit, and the shape of the photosensitive element is the same as the shape of the opening of the recognition unit.

Preferably, the collimator filter layer includes a plurality of light guide strips which are arranged at intervals in parallel, and the plurality of light guide strips are made of light shielding material; and, the photoelectric conversion layer is planar, and each of the plurality of light guide strips is perpendicular to the photoelectric conversion layer.

Preferably, the collimator filter layer further includes light shielding strip(s) located on an upper surface of at least one of the plurality of light guide strips, and the light shielding strip(s) is used for blocking incidence of light onto the upper surface of this light guide strip; and, the upper surface of this light guide strip is a surface of the light guide strip on a side away from the photoelectric conversion layer.

Preferably, the collimator filter layer has a thickness of 1-5 μm, and the light guide strips each have a width of 0.8-1.2 μm.

Preferably, the photoelectric conversion layer has a thickness of 0.8-1.2 μm.

In another aspect of the embodiments of the present disclosure, an OLED display device is provided. The OLED display includes the fingerprint recognition device described above.

Preferably, the fingerprint recognition device is arranged within a non-display region of the OLED display device.

Preferably, the OLED display device is of a top-emitting type and includes a display module; and, the fingerprint recognition device is arranged within a display region of the OLED display device and located on a side opposite to a light outgoing side of the display module, and the display module transmits light at a position corresponding to a photosensitive element.

Preferably, the display module includes a plurality of pixel units which are crisscrossed with each other; each of the plurality of pixel units includes at least three sub-pixels; and, each of the plurality of pixel unit corresponds to one recognition unit.

The present disclosure provides a fingerprint recognition device and an OLED display device. The fingerprint recognition device includes a plurality of recognition units alternately defined by a plurality of scanning lines and a plurality of signal reading lines which are crisscrossed with each other. One of the plurality of recognition units is provided with a switching transistor and a photosensitive element. A first electrode of the switching transistor is connected to a corresponding one of the plurality of signal reading lines defining this recognition unit, and a gate of the switching transistor is connected to a corresponding one of the plurality of scanning lines defining this recognition unit. The photosensitive element includes a photoelectric conversion layer and a collimator filter layer. The photoelectric conversion layer is connected to a second electrode of the switching transistor. The collimator filter layer is used for make incident light irradiate onto the photoelectric conversion layer in parallel, and the photoelectric conversion layer is used for performing photoelectric conversion on the incident light.

During the fingerprint recognition process, the plurality of scanning lines is input with activation signals line by line, so as to activate the plurality of recognition units line by line. After light reflected by a finger is irradiated onto the photosensitive element, the incident light can be irradiated onto the photoelectric conversion layer in parallel through the collimator filter layer, which performs photoelectric conversion on the incident light. Since the light reflected by a valley line of the finger and the light reflected by a ridge line of the finger are different in intensity, different photosensitive units for receiving the light reflected by the ridge line and the light reflected by the valley line can output, through respective photoelectric conversion layers, different electric signals to the signal reading lines connected to the photoelectric conversion layers. Thus, the purpose of recognizing the fingerprint of the finger is realized.

In this way, when the fingerprint recognition device is applied to a display device, even if the distance from a finger to the fingerprint recognition device is increased due to other components (e.g., cover glass) provided between the finger and the fingerprint recognition device, the collimator filter layer can make incident light irradiate onto the photoelectric conversion layer in parallel, so that the degree of scattering of the light reflected by the finger is reduced. Therefore, by the collimator filter layer, the probability of allowing the light reflected by the finger to be transmitted onto the photoelectric conversion layer can be increased, and the accuracy of fingerprint recognition by the photosensitive element can thus be improved.

BRIEF DESCRIPTION OF THE DRAWINGS

To describe the technical solutions in the embodiments of the present disclosure or in the prior art more clearly, the accompanying drawings to be used in the descriptions of the embodiments or the prior art will be briefly described below. Apparently, the accompanying drawings described hereinafter are some of embodiments of the present disclosure, and a person of ordinary skill in the art can obtain other accompanying drawings according to these drawings without paying any creative effort.

in which:

100: display device; 01: fingerprint recognition device; 02: cover glass; 03: optical adhesive; 10: recognition unit; 11: switching transistor; 12: photosensitive element; 13: pixel unit; 130: sub-pixel; 120: photoelectric conversion layer; 121: collimator filter layer; 1211: light guide strip; 123: light shielding strip; 30: insulating layer; 31: via hole; 300: display module; 32: display backplane; 33: organic functional layer; 34: cathode; 35: polarizer; 36: encapsulation thin film layer; A: non-display region; and, C: display region.

DETAILED DESCRIPTION OF THE PREFERRED EMBODIMENTS

The technical solutions in the embodiments of the present disclosure will be clearly and completely described below with reference to the accompanying drawings in the embodiments of the present disclosure. Apparently, the embodiments described herein are merely a part but not all of the embodiments of the present disclosure. All other embodiments obtained by a person of ordinary skill in the art without paying any creative effort on the basis of the embodiments in the present disclosure shall fall into the protection scope of the present disclosure.

Figure 2:
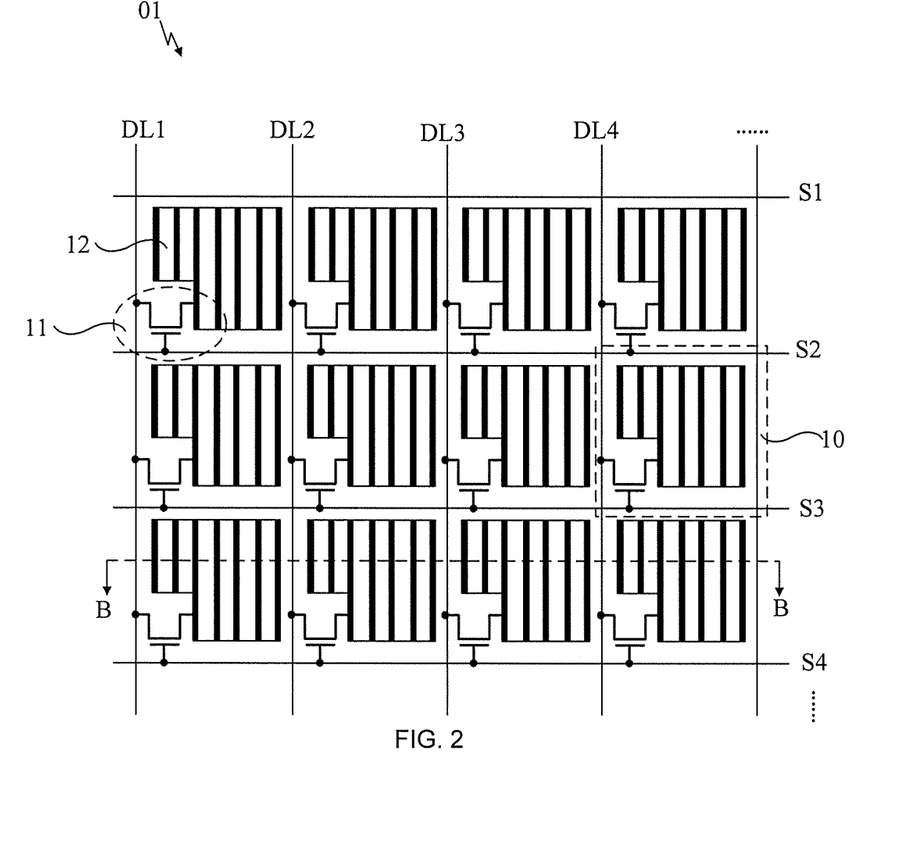
FIG. 2 is a structure diagram of a fingerprint recognition device according to an embodiment of the present disclosure.

A fingerprint recognition device 01 is provided, as shown in FIG. 2, including a plurality of recognition units 10 alternately defined by a plurality of scanning lines (S1, S2, S3, S4 . . . ) and a plurality of signal reading lines (DL1, DL2, DL3, DL4 . . . ) which are crisscrossed with each other. One of the plurality of recognition units 10 is provided with a switching transistor 11 and a photosensitive element 12. A first electrode of the switching transistor 11 is connected to a corresponding one (e.g., DL1) of the plurality of signal reading lines defining this recognition unit, and a gate of the switching transistor is connected to a corresponding one (e.g., S2) of the plurality of scanning lines defining this recognition unit.

Figure 3:
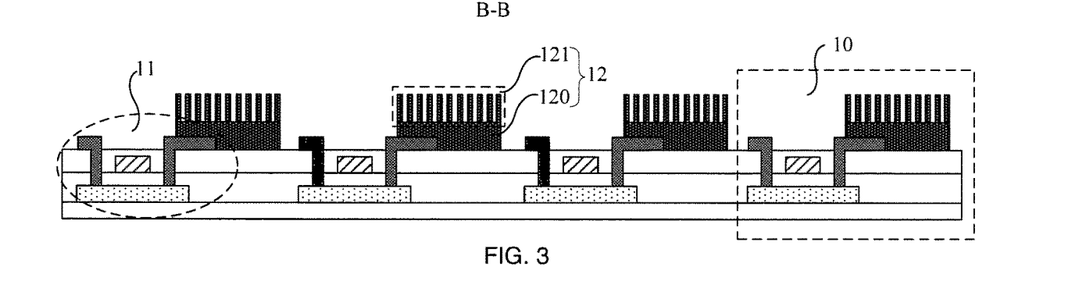
FIG. 3 is a sectional view of FIG. 2 taken along B-B.

On this basis, as shown in FIG. 3, the photosensitive element 12 includes a photoelectric conversion layer 120 and a collimator filter layer 121 which are stacked successively. The photoelectric conversion layer 120 is connected to a second electrode of the switching transistor 11. In this case, the collimator filter layer 121 is used for making incident light irradiate onto the photoelectric conversion layer 120 in parallel.

The photoelectric conversion layer 120 is used for performing photoelectric conversion on the incident light.

It is to be noted that, for the switching transistor 11, the first electrode is a source, and the second electrode is a drain; alternatively, the first electrode is a drain, and the second electrode is a source.

In addition, the type of the switching transistor 11 will be not limited in the present disclosure. The switching transistor may be a top-gate thin film transistor or a bottom-gate thin film transistor. In addition, the switching transistor may be a N-type thin film transistor or a P-type thin film transistor.

In this way, when the fingerprint recognition device 01 is applied to a display device, even if the distance from a finger to the fingerprint recognition device is increased due to other components (e.g., cover glass) provided between the finger and the fingerprint recognition device 01, the collimator filter layer 121 can make incident light irradiate onto the photoelectric conversion layer 120 in parallel, so that the degree of scattering of the light reflected by the finger is reduced. Therefore, by the collimator filter layer 121, the probability of allowing the light reflected by the finger to be transmitted onto the photoelectric conversion layer 120 can be increased, and the accuracy of fingerprint recognition by the photosensitive element 12 can thus be improved.

Figure 4:
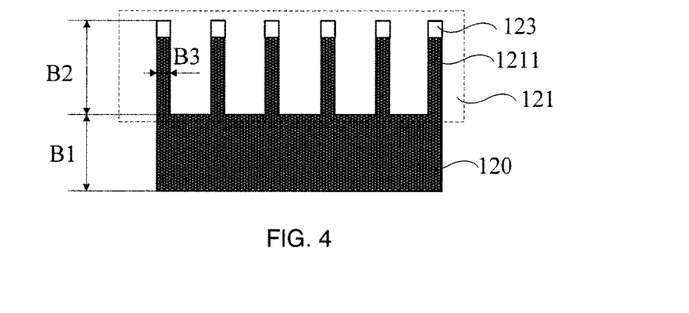
FIG. 4 is a structure diagram of a photosensitive element in FIG. 3.

Optionally, as shown in FIG. 4, the collimator filter layer 121 includes a plurality of light guide strips 1211 which are arranged at intervals in parallel. The plurality of light guide strips 1211 are made of light shielding material. In this case, after light reflected by the finger enters a gap between two adjacent light guide strips 1211 among the plurality of light guide strips, the light will be transmitted onto the photoelectric conversion layer 120 in an extension direction of the gap. In addition, since the light guide strips 1211 are made of light shielding material, crosstalk will not occur on light in two adjacent gaps.

On this basis, each of the plurality of light guide strips 1211 is perpendicular to the photoelectric conversion layer 120. In this way, the direction in which the gap extends between two adjacent light guide strips 1211 is also perpendicular to the photoelectric conversion layer 120, so that the light reflected by the finger can be transmitted in a direction perpendicular to the photoelectric conversion layer 120 through the collimator filter layer 121 and eventually transmitted onto the photoelectric conversion layer 120. It can be known from the above that, due to the plurality of light guide strips 1211, the light reflected by the finger can be perpendicularly transmitted onto the photoelectric conversion layer 120, so that the degree of scattering of the light reflected by the finger can be further reduced and the utilization of light can be improved.

On this basis, the fingerprint detection can be realized as long as it can be ensured that the photoelectric conversion layer 120 is provided at a position of at least one of the gaps. However, in order to increase the light receiving area and the accuracy of photoelectric conversion, preferably, the photoelectric conversion layer 120 is planar.

The process of the photosensitive element 12 performing fingerprint recognition will be described below in detail.

Figure 5:
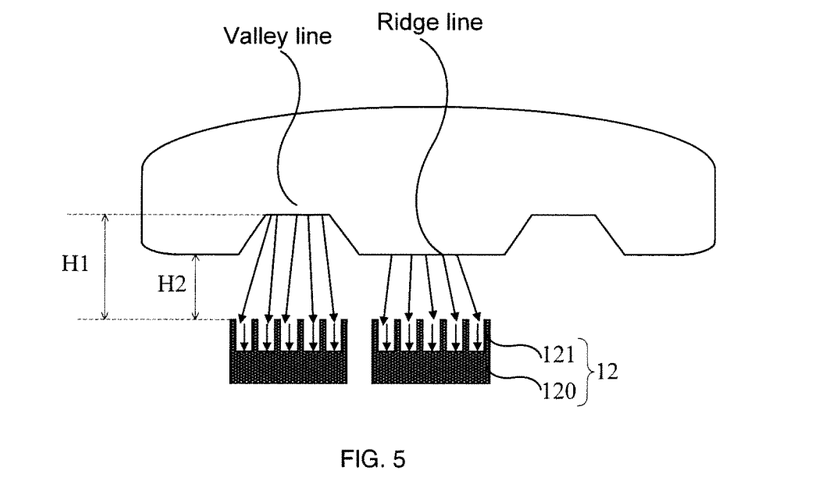
FIG. 5 is a schematic diagram of a fingerprint test on the photosensitive element shown in FIG. 3 or FIG. 4.

As shown in FIG. 5, there are ridge lines and valley lines on the surface of the finger. The distance from a valley line to the photosensitive element 12 is H1, the distance from a ridge line to the photosensitive element 12 is H2, and H1>H2. Therefore, light reflected to the collimator filter layer 121 by the valley lines has a lower intensity due to a larger transmission distance, while light reflected to the collimator filter layer 121 by the ridge lines has a higher intensity due to a smaller transmission distance. In this case, light, after being collimated by the collimator filter layer 121, perpendicularly transmits onto the photoelectric conversion layer 120 at a position corresponding to a valley line. Conversion layer 120 at this position receives light with a lower intensity, so that the converted current transmitted to the signal reading line (e.g., DL1) through the switching transistor connected to the photoelectric conversion layer 120 at this position is low. Meanwhile, light perpendicularly transmits onto he photoelectric conversion layer 120 at a position corresponding to a ridge line. Conversion layer 120 at this position receives light with a higher intensity, so that the converted current transmitted to the signal reading line (e.g., DL2) through the switching transistor connected to photoelectric conversion layer 120 at this position is high. In this way, by detecting the magnitude of current at different recognition units 10 output by different signal reading lines, the detection of valley lines or ridge lines of the fingerprint can be realized.

To realize the photoelectric conversion and to be advantageous for fabrication, the photoelectric conversion layer 120 may be preferably made of black organic photoelectric material. Optionally, the black organic photoelectric material includes all-organic semiconductor photoelectric material represented by polythiophene (POPT) derivatives or polyfluorene (PFO) derivatives. Optionally, the black organic photoelectric material may further include polymer doped fullerene (C60) and its derivatives, represented by double-layer heterojunction and bulk heterojunction material of polymer-fullerence and the like.

Figure 6:
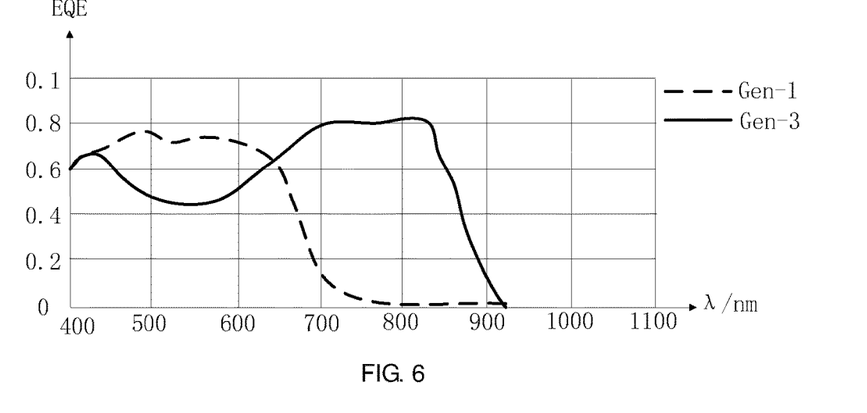
FIG. 6 is a schematic diagram of the photoelectric conversion rate of the material forming a photoelectric conversion layer of the photosensitive element shown in FIG. 3 or FIG. 4.

On this basis, by taking the photoelectric conversion layer 120 being mainly made of o-phenylenediamine (OPD) as example, the curve Gen_1 of the conversion rate of the first generation of OPD and the curve Gen_3 of the conversion rate of the third generation of OPD are shown in FIG. 6. It can be known from FIG. 6 that, when the photoelectric conversion layer 120 is made of the first generation of OPD, the conversion rate of the photoelectric conversion layer 120 converting light having a wavelength of 450 nm to 650 nm is greater than 0.6; and, when the photoelectric conversion layer 120 is made of the third generation of OPD, the conversion rate of the photoelectric conversion layer 120 converting light having a wavelength of 700 nm to 800 nm is greater than 0.8. Therefore, the photoelectric conversion layer 120 may be made of material having a high conversion rate according to the wavelength of light that needs to be reflected by the finger, thereby improving the photoelectric conversion efficiency.

On this basis, in order to simplify the fabrication process, as shown in FIG. 4, the collimator filter layer 121 and the photoelectric conversion layer 120 may be of an integral structure, and the collimator filter layer 121 and the photoelectric conversion layer 120 are made of the same material, i.e., the black organic photoelectric material. In this case, during the fabrication of the photosensitive element 12, first a black organic photoelectric material layer can be formed on a substrate, and then one patterning process can be proceeded, so as to form the planar photoelectric conversion layer 120 and the plurality of light guide strips 1211 that are arranged at intervals in parallel on a side of a light incident surface of the photoelectric conversion layer 120 and perpendicular to the light incident surface of the photoelectric conversion layer 120.

It is to be noted that, in the present disclosure, the patterning process may include a photoetching process, or include a photoetching process and an etching step, or may further include other processes for forming a predetermined pattern, such as printing or inkjet printing. The photoetching process is a process for forming a pattern using photoresists, masks, exposure machines or the like, including film forming, exposure, development or other processes. The corresponding patterning process may be selected according to the structure to be formed in the present disclosure.

In an embodiment, the one patterning process of the present disclosure is described by the following example: forming different exposure regions by one mask exposure process and then performing removal processes such as etching or ashing on the different exposure regions for multiple times to eventually obtain a desired pattern.

Further, optionally, as shown in FIG. 4, the photoelectric conversion layer 120 prepared by the above preparation method or other methods may have a thickness B1 of 0.8-1.2 μm. In an embodiment, the photoelectric conversion layer 120 has a thickness B1 of 0.8 μm. In another embodiment, the photoelectric conversion layer 120 has a thickness B1 of 1 μm. In another embodiment, the photoelectric conversion layer 120 has a thickness B1 of 1.2 μm. When the thickness of the photoelectric conversion layer 120 is less than 0.8 μm, the photoelectric conversion rate will be reduced due to a too small thickness. When the thickness of the photoelectric conversion layer 120 is greater than 1.2 μm, although the photoelectric conversion rate can be improved, the increase of the overall thickness of the photosensitive element 12 is disadvantageous for the design trend of ultra-thin display devices. On this basis, the photoelectric conversion layer 120 preferably has a thickness of 1 μm.

In addition, on one hand, the collimator filter layer 121 prepared by the above preparation method or other methods has a thickness B2 of 1-5 μm. In an embodiment, the collimator filter layer 121 has a thickness B2 of 1 μm. In another embodiment, the collimator filter layer 121 has a thickness B2 of 3 μm. In another embodiment, the collimator filter layer 121 has a thickness B2 of 5 μm. When the thickness of the collimator filter layer 121 is less than 1 μm, due to a too small height of the gap formed between two adjacent light guide strips 1211, the light guidance effect is poor, so that it is disadvantageous for collimating the incident light. When the thickness of the collimator filter layer 121 is greater than 5 μm, although the collimation and guidance effect on the incident light can be improved, it is disadvantageous for the design trend of ultra-thin display devices.

On the other hand, the light guide strips 1211 each have a width B3 of 0.8-1.2 μm. In an embodiment, the light guide strips 1211 each have a width B3 of 0.8 μm. In another embodiment, the light guide strips 1211 each have a width B3 of 1 μm. In another embodiment, the light guide strips 1211 each have a width B3 of 1.2 μm. Preferably, the light guide strips 1211 each have a width B3 of 1 μm, reducing the probability of interference of the incident light. In addition, during the fabrication process, in order to prevent one light beam from entering two adjacent gaps, the width of the gaps can be adjusted, so that the probability of interference of light in two adjacent gaps is reduced.

On this basis, as shown in FIG. 4, the collimator filter layer 121 further includes light shielding strip(s) 123 located on an upper surface of at least one of the plurality of light guide strips 1211. The light shielding strip(s) 123 is used for blocking incidence of light onto the upper surface of this light guide strip 1211. The upper surface of this light guide strip 1211 is a surface of the light guide strip 1211 on a side away from the photoelectric conversion layer 120. In this way, the incident light can be prevented from entering the inside of the light guide strips 1211 to result in the loss of light.

Preferably, the light shielding strips 123 may be made of metal material, black inorganic material capable of blocking light or the like.

Figure 7:
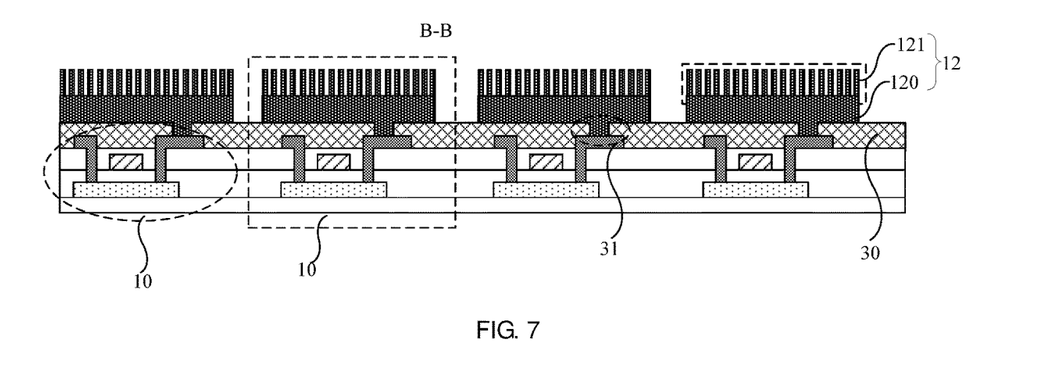
FIG. 7 is a sectional view of FIG. 2 taken along B-B.

Further, in order to increase area of the photosensitive element 12 which receives light and thus achieve the purpose of improving the photoelectric conversion efficiency, preferably, as shown in FIG. 7, the photosensitive element 12 may completely cover the switching transistor 11 connected to this photosensitive element 12.

In an embodiment, an insulating layer 30 is provided between the photoelectric conversion layer 120 in the photosensitive element 12 and the switching transistor 11. A via hole 31 is formed through the insulating layer 30 at a position corresponding to the second electrode of the switching transistor 11. The photoelectric conversion layer 120 is connected to the second electrode of the switching transistor 11 through the via hole 31.

Figure 8:
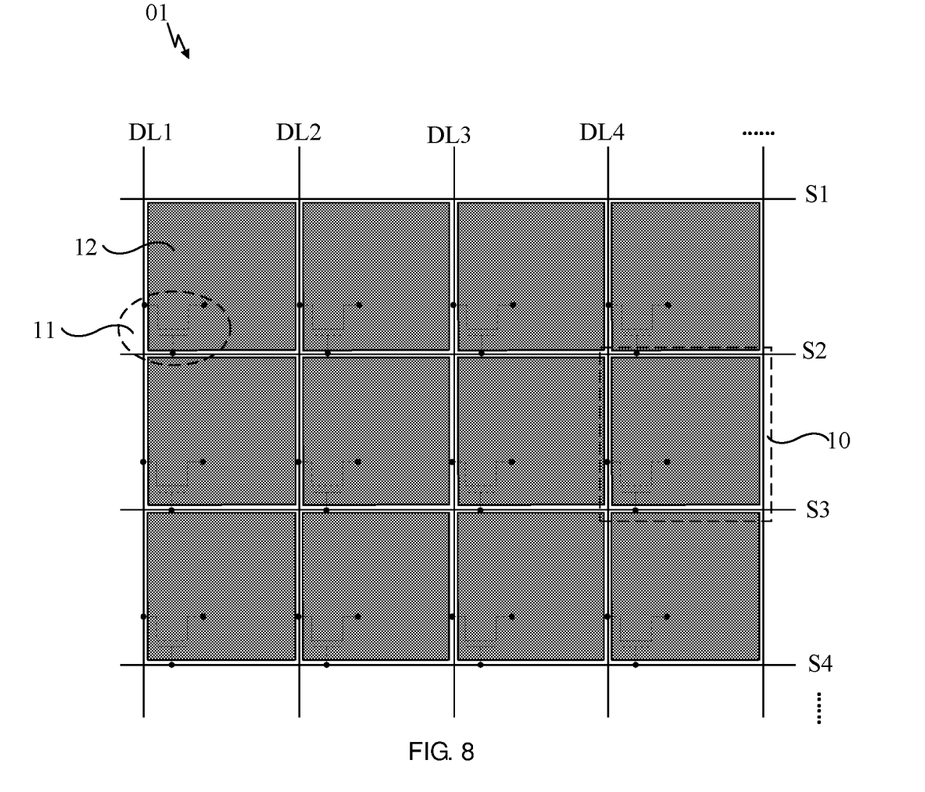
FIG. 8 is a structure diagram of another fingerprint recognition device according to an embodiment of the present disclosure.

On this basis, in order to further increase the area of the photosensitive element 12 which receives light, as shown in FIG. 8, the area of the photosensitive element 12 is the same as the area of an opening of the recognition unit 10. In addition, the shape of the photosensitive element 12 is the same as the shape of the opening of the recognition unit 10. The opening of the recognition unit 10 refers to a region surrounded by scanning lines (e.g., S1 and S2) and signal reading lines (e.g., DL1 and DL2) which are crisscrossed to define this recognition unit 10. In this case, when the plurality of scanning lines are arranged in parallel, the plurality of signal reading lines are arranged in parallel and any one scanning line is perpendicular to any one signal reading line, the shape of the opening of the recognition unit 10 is a rectangle, as shown in FIG. 8.

An embodiment of the present disclosure provides an OLED display device, including the fingerprint recognition device 01 described above. The OLED display device has the same structure and beneficial effects as those of the fingerprint recognition device 01, and they will not be repeated here since the structure and beneficial effects of the fingerprint recognition device 01 have been described in the foregoing embodiments.

The specific arrangement of the fingerprint recognition device 01 in the OLED device will be illustrated below in detail.

Figure 9:
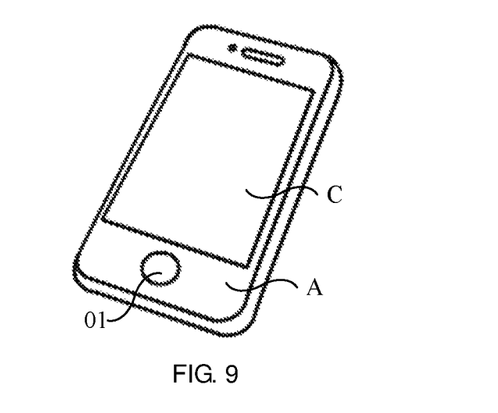
FIG. 9 is a schematic diagram of a way of arranging a fingerprint recognition device in an OLED display device according to an embodiment of the present disclosure.

For example, as shown in FIG. 9, the fingerprint recognition device 01 may be arranged within a non-display region A of the OLED display device, for example, at a position of the key Home. In this case, since the photosensitive element 12 of the fingerprint recognition device 01 has a collimator filter layer 121 capable of allowing light irradiated onto the photoelectric conversion layer 120 to be transmitted perpendicularly and in parallel, the degree of scattering of light reflected by a finger can be reduced. In this way, even if the finger does not directly come into contact with the fingerprint recognition device 01, majority of the light reflected by the finger can still enter the fingerprint recognition device 01, so that the efficiency and accuracy of fingerprint recognition can be ensured and the definition of acquired fingerprint images can be improved. In addition, the key Home can also be directly omitted to reduce the cost.

Figure 10:
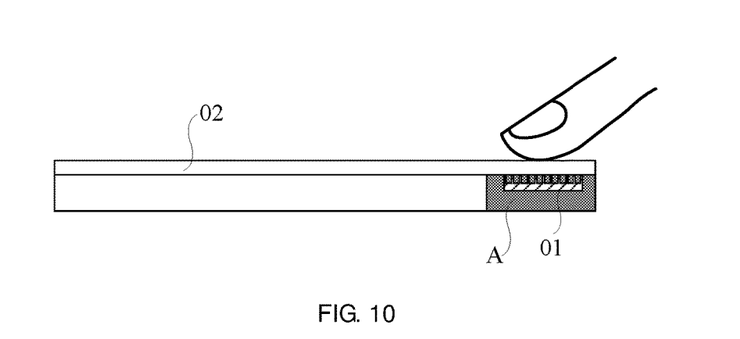
FIG. 10 is a schematic diagram of arrangement of the fingerprint recognition device in FIG. 9 within a non-display region.

In this case, since the finger is not required to directly come into contact with the fingerprint recognition device 01, as shown in FIG. 10, it is unnecessary to form a touch hole on cover glass 02 of the OLED device at a position corresponding to the fingerprint recognition device 01. In this way, the manufacturing process of the cover glass 02 can be simplified, the product yield can be improved, and the flatness of the surface of the display device can be ensured.

Figure 11:
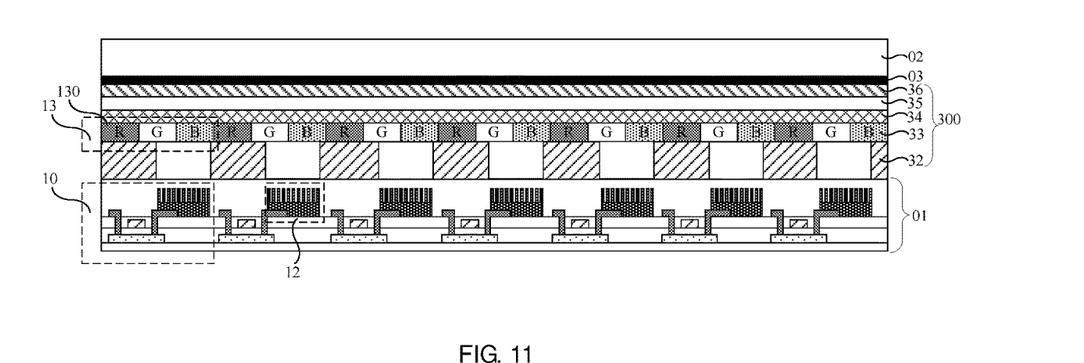
FIG. 11 is a schematic diagram of another way of arranging a fingerprint recognition device in an OLED display device according to an embodiment of the present disclosure.

Or, for another example, when the OLED display device is of a top-emitting type, as shown in FIG. 11, the fingerprint recognition device 01 may be arranged within a display region C of the OLED display device.

Specifically, the OLED display device includes a display module 300. The display module 300 includes a display backplane 32, organic function layers 33 (including a hole injection layer, a hole transmission layer, a luminescent layer, an electron transmission layer, an electron injection layer, a color filter layer and the like) successively located above the display backplane 32, a cathode 34, a polarizer 35 and an encapsulation thin film layer 36 (or an encapsulation cover plate). In addition, the OLED display device further includes cover glass 02. The cover glass 02 is fitted with the display module 300 through an optical adhesive 03.

On this basis, the fingerprint recognition device 01 is arranged on a side opposite to a light outgoing side of the display module 300. In order to ensure that the light reflected by the finger can be irradiated onto the photosensitive element 12 of the fingerprint recognition device 01, the display module 300 transmits light at a position corresponding to the photosensitive element 12. Optionally, it is possible to set the wiring mode of a pixel circuit in the display backplane 32 in such a way that a data lead and electronic elements such as transistors or capacitors will not be distributed on the display backplane 32 at a position corresponding to the photosensitive element 12. Or, it is also possible to form a via hole through the display backplane 32 at a position corresponding to the photosensitive element 12, so that the light reflected by the finger can transmit through a position where no electronic element is provided or the via hole is formed and then irradiates into the photosensitive element 12.

During the fingerprint recognition process, the top-emitting OLED display device emits display light on a side away from the fingerprint recognition device 01. When the finger touches the cover glass 02, the finger can reflect the display light. Although the finger cannot directly come into contact with the fingerprint recognition device 01 since the fingerprint recognition device 01 is arranged on a side opposite to the light outgoing side of the display module 300, the photosensitive element 12 of the fingerprint recognition device 01 can enable the reflected light to be perpendicularly transmitted to the photoelectric conversion layer 120 in parallel after transmitting through the collimator filter layer 121, so that the degree of scattering of the light reflected by the finger can be reduced. In this way, majority of the light reflected by the finger can still enter the fingerprint recognition device 01, so that the efficiency and accuracy of fingerprint recognition can be ensured and the definition of acquired fingerprint images can be improved.

On this basis, the display module 300 includes a plurality of pixel units 13 which are crisscrossed with each other. Each pixel unit 13 among the plurality of pixel units includes at least three sub-pixels 130, for example, a red sub-pixel, a blue sub-pixel and a green sub-pixel. Each pixel unit 13 corresponds to one recognition unit 10. In this way, after the resolution of the OLED display device is improved, the Pixels Per Inch (PPI) of the OLED display device increases, and the number of the pixel units 13 also increases, so that the number of the recognition units 10 increases. Accordingly, the accuracy of fingerprint recognition can be improved.

Alternatively, in order to reduce the fabrication accuracy and cost, each recognition unit 10 may correspond to an integral number of pixel units 13, for example, three pixel units 13 or four pixel units 13.

The foregoing descriptions merely show specific implementations of the present disclosure, and the protection scope of the present disclosure is not limited thereto. Any person of skill in the art can readily conceive of variations or replacements within the technical scope disclosed by the embodiments of the present disclosure, and these variations or replacements shall fall into the protection scope of the present disclosure. Accordingly, the protection scope of the present disclosure shall be subject to the protection scope of the claims.

What is claimed is:

1. A fingerprint recognition device, comprising a plurality of recognition units alternately defined by a plurality of scanning lines and a plurality of signal reading lines which are crisscrossed with each other, wherein one of the plurality of recognition units is provided with a switching transistor and a photosensitive element, with a first electrode of the switching transistor being connected to a corresponding one of the plurality of signal reading lines defining this recognition unit and a gate of the switching transistor being connected to a corresponding one of the plurality of scanning lines defining this recognition unit; and the photosensitive element comprises a photoelectric conversion layer and a collimator filter layer which are stacked successively, with the photoelectric conversion layer being connected to a second electrode of the switching transistor, the collimator filter layer being used for making incident light irradiate onto the photoelectric conversion layer in parallel, and the photoelectric conversion layer being used for performing photoelectric conversion on the incident light, wherein the collimator filter layer and the photoelectric conversion layer are of an integral structure, and the collimator filter layer is in direct contact with the photoelectric conversion layer, and the collimator filter layer and the photoelectric conversion layer are made of the same material, i.e., black organic photoelectric material.

2. The fingerprint recognition device according to claim 1, wherein the photosensitive element completely covers the switching transistor; and an insulating layer is provided between the photoelectric conversion layer and the switching transistor, a via hole is formed on the insulating layer at a position corresponding to the second electrode of the switching transistor, and the photoelectric conversion layer is connected to the second electrode of the switching transistor through the via hole.

3. The fingerprint recognition device according to claim 1, wherein the area of the photosensitive element is the same as the area of an opening of the recognition unit; and the shape of the photosensitive element is the same as the shape of the opening of the recognition unit.

4. The fingerprint recognition device according to claim 1, wherein the collimator filter layer comprises a plurality of light guide strips which are arranged at intervals in parallel, and the plurality of light guide strips are made of light shielding material; and the photoelectric conversion layer is planar, and each of the plurality of light guide strips is perpendicular to the photoelectric conversion layer.

5. The fingerprint recognition device according to claim 4, wherein the collimator filter layer further comprises light shielding strip(s) located on an upper surface of at least one of the plurality of light guide strips, and the light shielding strip(s) is used for blocking incidence of light onto the upper surface of this light guide strip; and the upper surface of this light guide strip is a surface of the light guide strip on a side away from the photoelectric conversion layer.

6. The fingerprint recognition device according to claim 4, wherein the collimator filter layer has a thickness of 1-5 μm, and the light guide strips each have a width of 0.8-1.2 μm.

7. The fingerprint recognition device according to claim 4, wherein the photoelectric conversion layer has a thickness of 0.8-1.2 μm.

8. An OLED display device, comprising the fingerprint recognition device according to claim 1.

9. The OLED display device according to claim 8, wherein the fingerprint recognition device is arranged within a non-display region of the OLED display device.

10. The OLED display device according to claim 8, wherein the OLED display device is of a top-emitting type and comprises a display module; and the fingerprint recognition device is arranged within a display region of the OLED display device and located on a side opposite to a light outgoing side of the display module, wherein, the display module transmits light at a position corresponding to the photosensitive element.

11. The OLED display device according to claim 10, wherein the display module comprises a plurality of pixel units which are crisscrossed with each other, and each of the plurality of pixel units comprises at least three sub-pixels; and each of the plurality of pixel unit corresponds to one recognition unit.

12. A fingerprint recognition device, comprising a plurality of recognition units alternately defined by a plurality of scanning lines and a plurality of signal reading lines which are crisscrossed with each other, wherein one of the plurality of recognition units is provided with a switching transistor and a photosensitive element, with a first electrode of the switching transistor being connected to a corresponding one of the plurality of signal reading lines defining this recognition unit and a gate of the switching transistor being connected to a corresponding one of the plurality of scanning lines defining this recognition unit; and the photosensitive element comprises a photoelectric conversion layer and a collimator filter layer which are stacked successively, with the photoelectric conversion layer being connected to a second electrode of the switching transistor, the collimator filter layer being used for making incident light irradiate onto the photoelectric conversion layer in parallel, and the photoelectric conversion layer being used for performing photoelectric conversion on the incident light, wherein the collimator filter layer comprises a plurality of light guide strips which are arranged at intervals in parallel, and the plurality of light guide strips are made of light shielding material; and the photoelectric conversion layer is planar, and each of the plurality of light guide strips is perpendicular to the photoelectric conversion layer, wherein the collimator filter layer further comprises light shielding strip(s) located on an upper surface of at least one of the plurality of light guide strips, and the light shielding strip(s) is used for blocking incidence of light onto the upper surface of this light guide strip; and the upper surface of this light guide strip is a surface of the light guide strip on a side away from the photoelectric conversion layer, the projections of each light guide strip and a corresponding light shielding strip on the photoelectric conversion layer coincide.

* * * * *